United States Patent
Allen et al.

(10) Patent No.: US 6,532,097 B1
(45) Date of Patent: Mar. 11, 2003

(54) IMAGE REGISTRATION APPARATUS HAVING AN ADJUSTABLE REFLECTIVE DIFFRACTION GRATING AND METHOD

(75) Inventors: Paul C. Allen, Beaverton, OR (US); Samuel C. Howells, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/976,978

(22) Filed: Oct. 11, 2001

(51) Int. Cl.[7] .............................. G02F 1/00; G02F 1/11
(52) U.S. Cl. ........................................ 359/237; 359/285
(58) Field of Search ................................. 359/237, 245, 359/279, 276, 278, 558, 566, 569, 572

(56) References Cited

U.S. PATENT DOCUMENTS

| | | | |
|---|---|---|---|
| 4,796,038 A | 1/1989 | Allen et al. ................... | 396/548 |
| 5,030,977 A * | 7/1991 | Hanson et al. ................ | 347/131 |
| 5,386,221 A | 1/1995 | Allen et al. ................... | 347/239 |
| 5,461,239 A | 10/1995 | Atherton ....................... | 250/566 |
| 5,629,801 A | 5/1997 | Staker et al. ................. | 359/572 |
| 5,661,592 A | 8/1997 | Bornstein et al. ............ | 359/291 |
| 5,764,280 A | 6/1998 | Bloom et al. ................. | 348/53 |
| 5,808,797 A | 9/1998 | Bloom et al. ................. | 359/572 |
| 5,841,579 A | 11/1998 | Bloom et al. ................. | 359/572 |
| 5,892,553 A | 4/1999 | Delmas ........................ | 348/578 |
| 5,920,380 A | 7/1999 | Sweatt ......................... | 355/77 |
| 5,982,553 A | 11/1999 | Bloom et al. ................. | 359/627 |
| 6,037,967 A | 3/2000 | Allen et al. ................... | 347/255 |
| 2002/0024708 A1 * | 2/2002 | Lewis et al. .................. | 359/197 |
| 2002/0081017 A1 * | 6/2002 | Smith et al. .................. | 382/151 |

OTHER PUBLICATIONS

Bloom, et al. "The Grating Light Valve: revolutionizing display technology", D.M. Bloom, Silicon Light Machines, 1997, www.siliconlight.com/webpdf/pw97.pdf.

Amm, et al. Grating Light Valve (TM) Technology: Update and Novel Application, Silicon Light Machines, Sunnyvale CA, Presented at Society for Information Display Symposium, May 19, 1998, Anaheim, CA.

* cited by examiner

Primary Examiner—Georgia Epps
Assistant Examiner—Omar Hindi
(74) Attorney, Agent, or Firm—Janah & Associates (57) ABSTRACT

An image registration apparatus has a substrate support capable of supporting a substrate, the substrate support having a support motor capable of moving the substrate support. A radiation beam source is provided that is capable of providing a radiation beam. A beam intensity modulator is also provided that has an adjustable reflective diffraction grating capable of reflectively diffracting the radiation beam to modulate the intensity of the radiation beam. A controller is also provided that is adapted to control the substrate support, radiation beam source, and beam intensity modulator to modulate and scan the radiation beam across the substrate to register an image on the substrate.

19 Claims, 7 Drawing Sheets

IMAGE REGISTRATION APPARATUS HAVING AN ADJUSTABLE REFLECTIVE DIFFRACTION GRATING AND METHOD

BACKGROUND

Embodiments of the present invention relate to the registration of an image on a substrate.

An image registration apparatus scans one or more radiation beams on a substrate to register an image on the substrate. The radiation beams are modulated or patterned in accordance with the image to be registered onto the substrate. A typical image registration apparatus comprises a substrate support and radiation beam source, focusing, modulating, and scanning components, to generate and modulate a radiation beam to form an image on the substrate. The substrate may be, for example, a mask blank to be used in the fabrication of semiconductors, and which is exposed to the modulated radiation beam to register an circuit image onto photosensitive material of the mask blank. The mask blank is then developed and stabilized to form a mask to be used in the fabrication of integrated circuits.

It is desirable to increase the image registration speeds to generate high resolution images with good throughput. However, image registration speeds are often limited by the speed of the radiation beam modulators that modulate the intensities of the radiation beams. For example, one commonly used radiation beam modulator is an acousto-optic modulator (AOM) which modulates a radiation beam by constructive and destructive interference of the radiation beam. A typical AOM is capable of modulating about 32 beams at a rate of about 50 MHz and within about 16 grayscale levels to provide an image data processing speed of about 1.6 GHz. While such image data processing speeds are acceptable for conventional image registration methods, faster data throughput is often required to register images having higher levels of complexity and finer line widths.

Thus, it is desirable to have an image registration apparatus and method that provides higher image registration speeds without sacrificing image resolution. It is also desirable to provide the higher data throughput rates consistently and reliably.

SUMMARY

An image registration apparatus comprises a substrate support capable of supporting a substrate, the substrate support comprising a support motor; a radiation beam source capable of providing a radiation beam; a beam intensity modulator comprising an adjustable reflective diffraction grating capable of reflectively diffracting the radiation beam to modulate the intensity of the radiation beam; and a controller adapted to control the substrate support, radiation beam source, and beam intensity modulator to modulate and scan the radiation beam across the substrate to register an image on the substrate.

A method of registering an image on a substrate comprises placing a substrate on a substrate support; directing a radiation beam toward the substrate; modulating the intensity of the radiation beam by reflectively diffracting the radiation beam; and scanning the modulated radiation beam across the substrate to register an image on the substrate.

An apparatus for registering an image on a mask blank comprises a substrate support capable of supporting a mask blank, the substrate support comprising a support motor; a laser beam source capable of providing a laser beam that may be split into a plurality of laser beamlets; a beam intensity modulator comprising an adjustable reflective diffraction grating capable of reflectively diffracting the laser beamlets to modulate the intensities of the laser beamlets, the adjustable reflective diffraction grating comprising a plurality of fixed reflectors and a plurality of adjustable reflectors that are adjustable between first and second positions; and a controller adapted to control the substrate support, laser beam source, and beam intensity modulator, to modulate and scan the laser beamlets across the mask blank to register an image on the mask blank.

A method of registering an image on a mask blank comprises placing a mask blank on a substrate support; directing a laser beam toward the mask blank; splitting the laser beam into a plurality of laser beamlets; reflectively diffracting the radiation beamlets to modulate the intensities of the laser beamlets by adjusting a plurality of adjustable reflectors between first and second positions while maintaining a plurality of fixed reflectors at a fixed position; and scanning the modulated laser beamlets across the mask blank to register an image on the mask blank.

An apparatus for registering an image on a mask blank comprises a substrate support capable of supporting a mask blank, the substrate support comprising a support motor; a laser beam source capable of providing a laser beam that may be split into a plurality of laser beamlets; a beam intensity modulator comprising an adjustable reflective diffraction grating capable of reflectively diffracting the laser beamlets to modulate the intensities of the laser beamlets, the adjustable reflective diffraction grating comprising at least about 160 reflector clusters, each reflector cluster comprising a plurality of fixed and adjustable reflectors that are adapted to reflectively diffract a laser beamlet, and wherein the adjustable reflectors are adjustable between first and second positions; and a controller adapted to control the substrate support, laser beam source, and beam intensity modulator, to modulate the laser beamlets at a modulation rate of less than about 10 MHz while scanning the laser beamlets across the mask blank to register an image on the mask blank.

A method of registering an image on a mask blank comprises placing a mask blank on a substrate support and moving the substrate support; projecting a laser beam toward the mask blank; splitting the laser beam into a plurality of laser beamlets; modulating the laser beamlets by applying a signal at a modulation frequency of less than about 10 MHz to at least about 160 reflector clusters, each reflector cluster comprising a plurality of fixed and adjustable reflectors that reflectively diffract the laser beamlets, wherein the adjustable reflectors are adjustable between first and second positions and the fixed reflectors are maintained at fixed positions; and scanning the modulated radiation beam across the mask blank to register an image may be registered on the mask blank.

DRAWINGS

These features, aspects, and advantages of the present invention will become better understood with regard to the following description, appended claims, and accompanying drawings which illustrate examples of the invention. However, it is to be understood that each of the features can be used in the invention in general, not merely in the context of the particular drawings, and the invention includes any combination of these features, where:

FIG. 4a is a schematic perspective view of the reflector cluster of FIG. 3a;

DESCRIPTION

Figure 1:
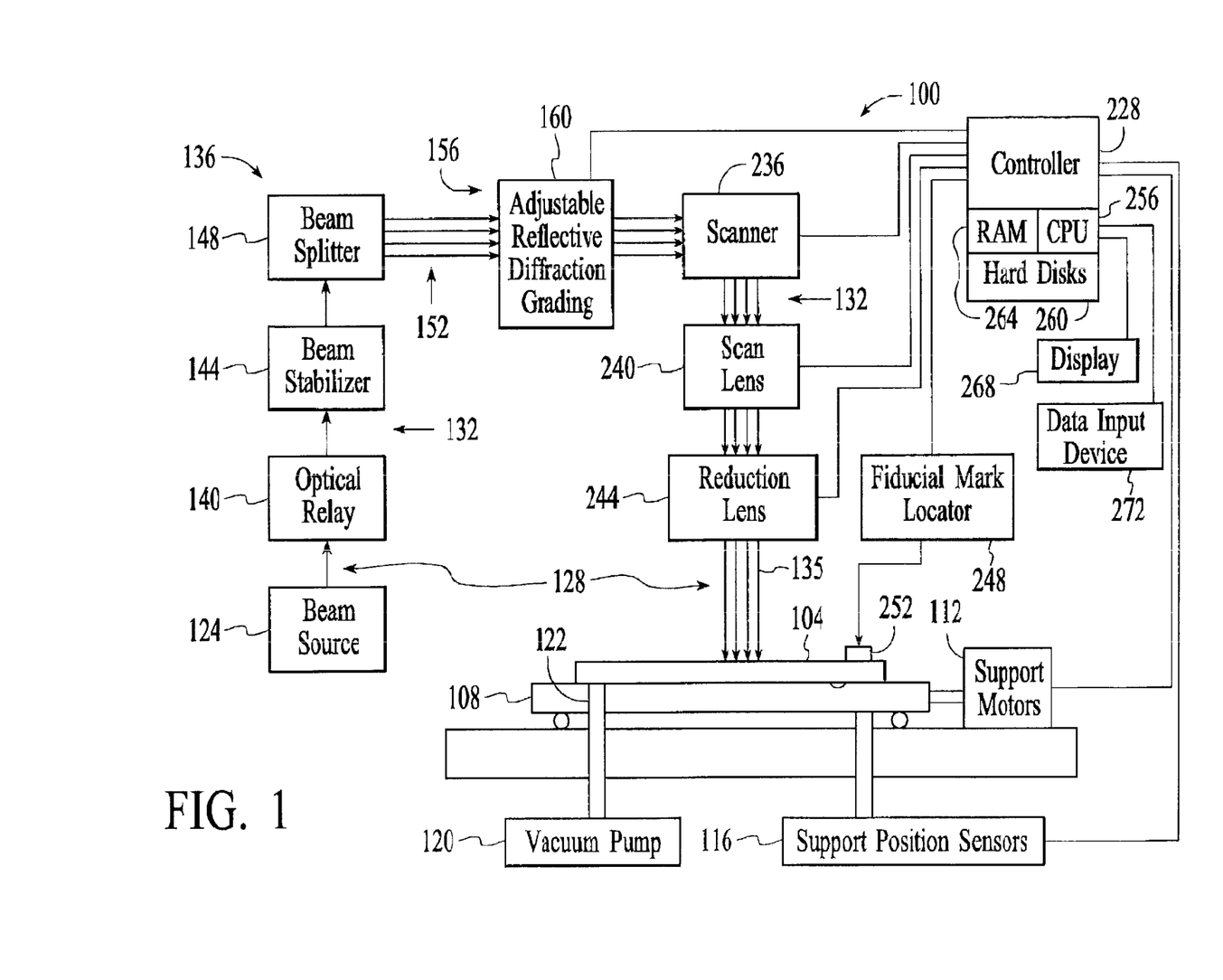
FIG. 1 is a schematic diagram of an image registration apparatus according to an embodiment of the present invention showing a beam modulating component comprising an adjustable reflective diffraction grating.

A radiation beam image registration apparatus according to the present invention may be used to register an image on a substrate. An exemplary version of an apparatus 100, as schematically illustrated in FIG. 1, is suitable for registering an image, which is typically a pattern representative of electronic circuitry or an electronic device, on a substrate 104, for example, a substrate suitable for use in the fabrication of integrated circuits. For example, the apparatus 100 may be a mask-making apparatus suitable for registering the image on a substrate 104, such as a mask blank. The substrate 104 is exposed in the apparatus 100 to a modulated radiation beam to register an image in photosensitive material of the mask blank. The mask blank is then developed and stabilized to fix the image and used in the fabrication of integrated circuits. The illustrative version of the apparatus 100 provided herein should not be used to limit the scope of the invention, and the invention encompasses equivalent or alternative versions, as would be apparent to one of ordinary skill in the art.

Generally, the apparatus 100 comprises a substrate support 108 capable of supporting the substrate 104. The substrate support 108 has a support motor 112 to move the substrate support 108 to position the substrate 104. For example, the support motor 112 may comprise an electric motor capable of translating the substrate support 108 in the x and y directions along an x-y plane parallel to the substrate surface, rotate the substrate support 108, move the substrate support 108 vertically up and down along the axis orthogonal to its plane, or tilt the substrate support 108. Support position sensors 116 are capable of precisely determining the position of the substrate support 108 and of the substrate 104 itself. For example, the support position sensors 116 may operate by reflecting a light beam (not shown) from the substrate support 108 and measuring the position interferometrically. A vacuum pump 120 and vacuum port 122, which may be a channel extending circumferentially below the substrate 104, are provided to securely hold the substrate 104 by vacuum force.

A radiation beam source 124 is provided to generate a radiation beam 128 that travels along a radiation beam path 132 to the substrate 104. The radiation beam source 124 may be, for example, a substantially coherent light source, such as a laser beam source, or an incoherent light source, producing light in the ultraviolet, visible, or infrared parts of the frequency spectrum. In the exemplary version, the radiation beam source 124 generates a collimated multi-wavelength radiation beam, such as continuous-wave ultraviolet laser beam having primary spectral lines at wavelengths 351 nm, 364 nm and 380 nm, and emanating from an Argon ion laser, commercially available from Coherent, Inc., Santa Clara, Calif. Multiple radiation beam sources may also be used instead of a single radiation beam source.

A number of beam modulating components 136 are in the radiation beam path 132 to modulate the radiation beam 128. The components 136 may include an optical relay 140 to transport the radiation beam 128 along the beam path 132 from the radiation beam source 124 to an active beam stabilizer 144. The optical relay 140 comprises optical elements capable of passively shaping the radiation beam 128 to a suitable shape. The components 136 may also include an active beam stabilizer 144 having optical elements which are capable of adjusting and maintaining a stabilized position of the radiation beam 128.

In one version, a beam splitter 148 splits the radiation beam 128 into a plurality of radiation beamlets 152. The beam splitter 148 may comprise a number of parallel plates that split the radiation beam 128 into a number of spatially separated beamlets 152 that each have approximately the same beam intensity, as for example, described in U.S. Pat. No. 5,386,221, which is incorporated herein by reference in its entirety. In another version, the beam splitter 148 is a diffractive beam splitter comprising fixed diffraction gratings that are constructed to split the radiation beam 128 into a plurality of beamlets 152 having different orders, as for example, described in Feldman, et al., Optics Letters, Vol. 14, pp. 479 to 481, which is incorporated herein by reference in its entirety. Suitable diffractive optical beam splitters 148 are manufactured by Rochester Photonics Corp., Rochester, N.Y. The beam splitter 148 typically splits the radiation beam 128 into, for example, from about 20 beamlets to about 2000 beamlets, and in one version about 32 beamlets. Thus, the radiation beam 128 may be a single beam, a number of beamlets, or a number of separate beams.

Figure 2:
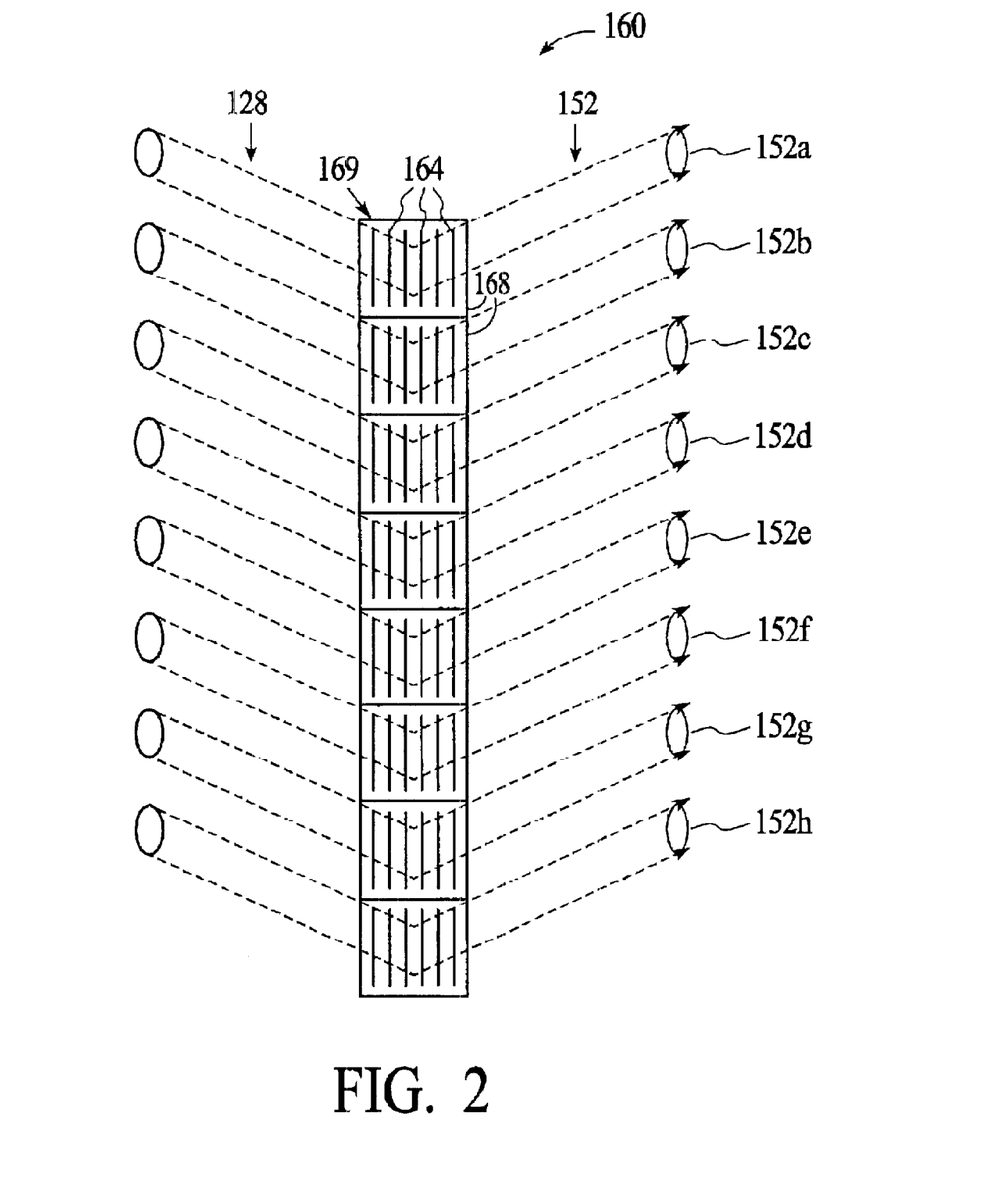
FIG. 2 is a schematic top view of an adjustable reflective diffraction grating showing clusters of reflectors that each modulate a radiation beamlet.

The beam modulating components 136 also include a beam intensity modulator 156 capable of modulating the intensity of the radiation beam 128. In one version, the beam intensity modulator 156 is an adjustable reflective diffraction grating 160 that diffracts the radiation beam 128, as shown in FIG. 2. The adjustable reflective diffraction grating 160 is capable of adjustably reflectively diffracting the radiation beam 128. By reflectively diffracting it is meant that the adjustable grating 160 operates by reflecting the radiation beam 128 in either a diffracted or a non-diffracted state. In one version, the adjustable grating 160 comprises one or more reflectors 164 capable of reflectively diffracting the radiation beam 128, in accordance with an applied electrical signal relating to the image to be registered onto the substrate 104. For example, the reflectors 164 may be capable of diffracting the radiation beamlets 152 to turn the beamlets 152 on and off and to control an intensity of the radiation beam 28 that is reflectively diffracted.

In one version, the reflectors 164 are arranged as one or more clusters 168 that correspond to the configuration of the radiation beamlets 152 so that each reflector cluster 168 modulates the intensity of a radiation beamlet 152, as for example, illustrated in FIG. 2. An array 169 of such reflector clusters 168 is capable of modulating a plurality of radiation beamlets 152. The array 169 may be formed by aligning the reflector clusters 168 substantially along a line in order to modulate the intensity of a linearly spaced apart array of beamlets 152 to form a "brush" that is capable of registering an image on the substrate 104. The array 169 may also comprise reflector clusters 168 that are arranged according to a two-dimensional grid of reflectors 164 comprising parallel lines of the arrays 169, for example, to correspond to a matching grid pattern of the radiation beamlets 152.

Figure 3A:
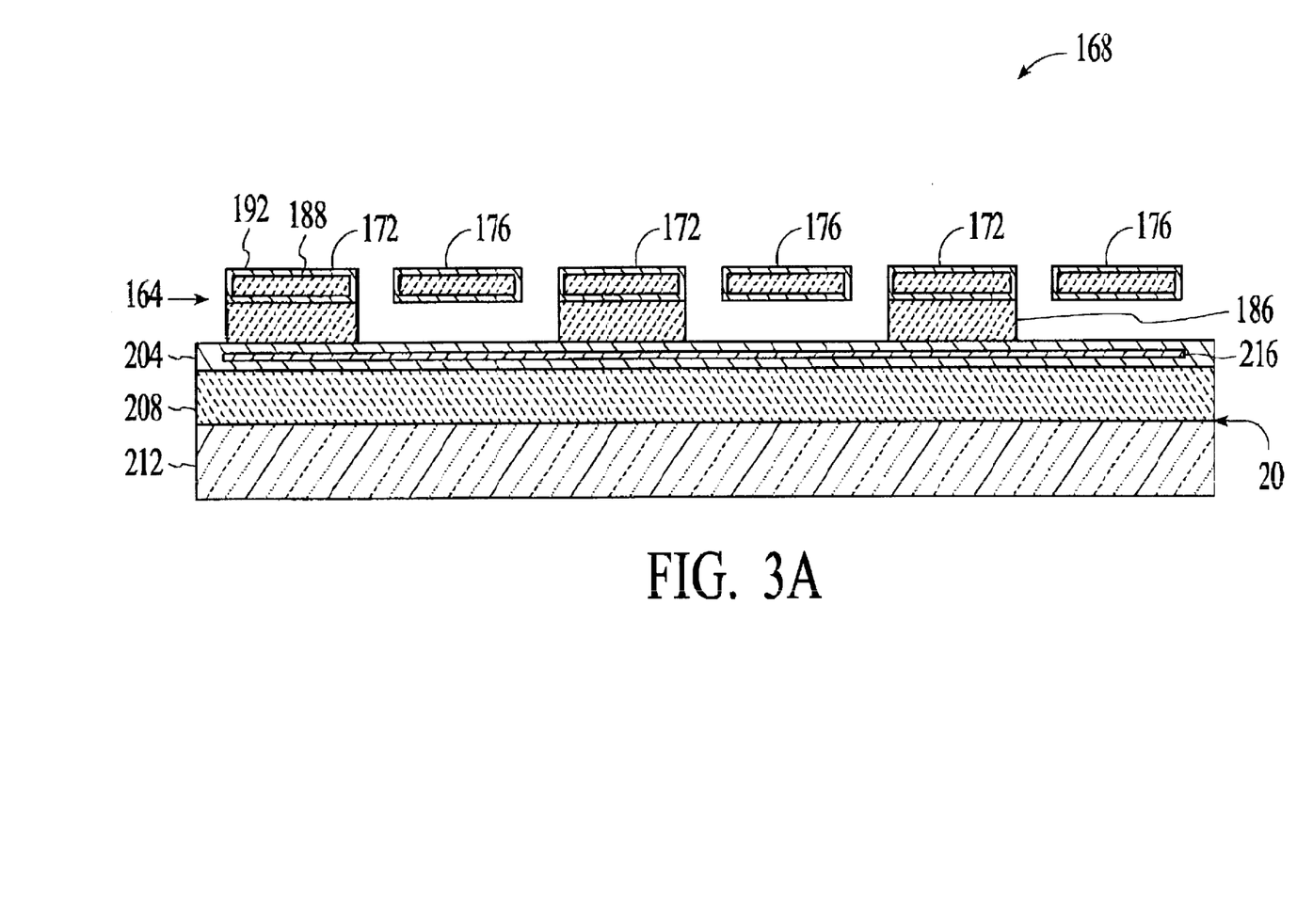
FIG. 3a is a schematic sectional front view of an exemplary reflector cluster.
Figure 3B:
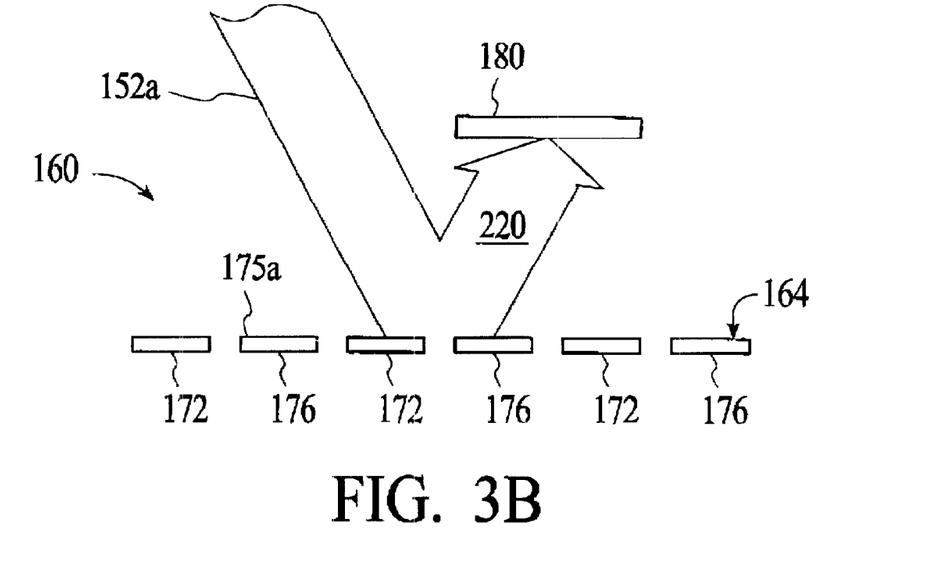
FIG. 3b is a schematic sectional side view of the reflector cluster of FIG. 3a showing the adjustable reflectors in their first positions.
Figure 3C:
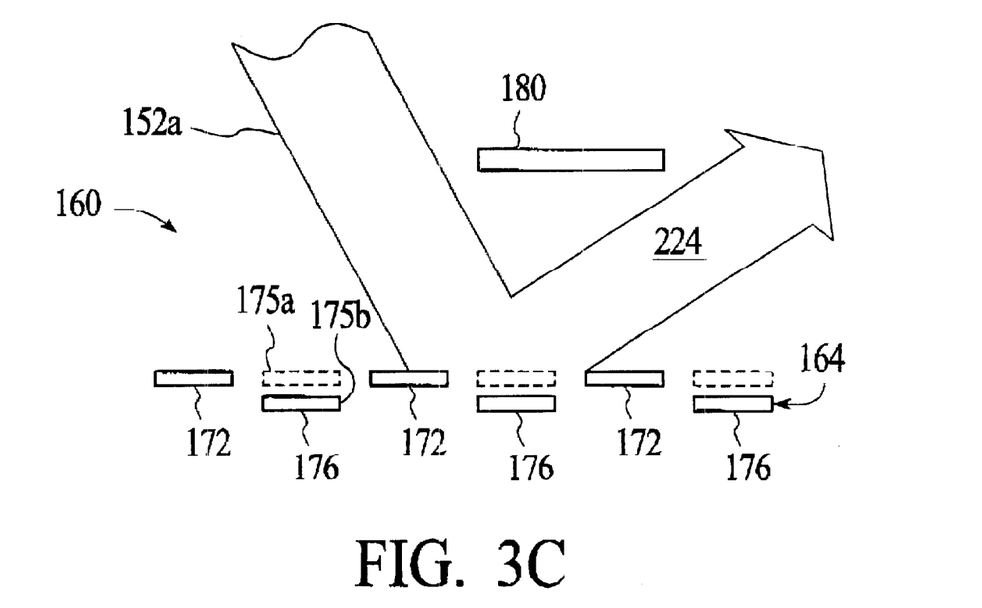
FIG. 3c shows the reflector cluster of FIG. 3b with the adjustable reflectors in their second positions.

The adjustable reflective diffraction grating 160 comprises a plurality of fixed and adjustable reflectors 172, 176, respectively, to modulate the radiation beamlets 152, as shown in FIGS. 3b and 3c. The fixed reflectors 172 remain in fixed positions relative to the adjustable reflectors 176. The adjustable reflectors 176 may be displaced relative to the fixed reflectors 172 to diffract the radiation beamlets 152 and thereby modulate their intensities. For example, the adjustable reflectors 176 may be adjustable between first and second positions 175a, 175b, to controllably reflectively diffract the radiation beamlets 152. In one version, the first positions 175a are non-diffracting positions in which the radiation beamlets 152 are not diffracted, as shown in FIG. 3b, and the second positions 175b are diffracting positions in which the radiation beamlets 152 are diffracted, as shown in FIG. 3c. Generally, the reflectors 164 are shaped, sized, and arranged to cover a beam spot area of the radiation beamlets 152 to diffract the radiation beamlets 152 across its entire beam spot size. The shapes and sizes of the reflectors 164 and the spacing between the reflectors 164 affects the amount of radiation diffracted. The shapes and sizes of the reflectors 164 may also be selected to control the image modulating speed. For example, smaller reflectors 176, 172 that diffract smaller beamlets 152 may provide a higher modulation frequency and faster modulating times than larger reflectors 176, 172 that are capable of diffracting larger beamlets 152.

Figure 4A:
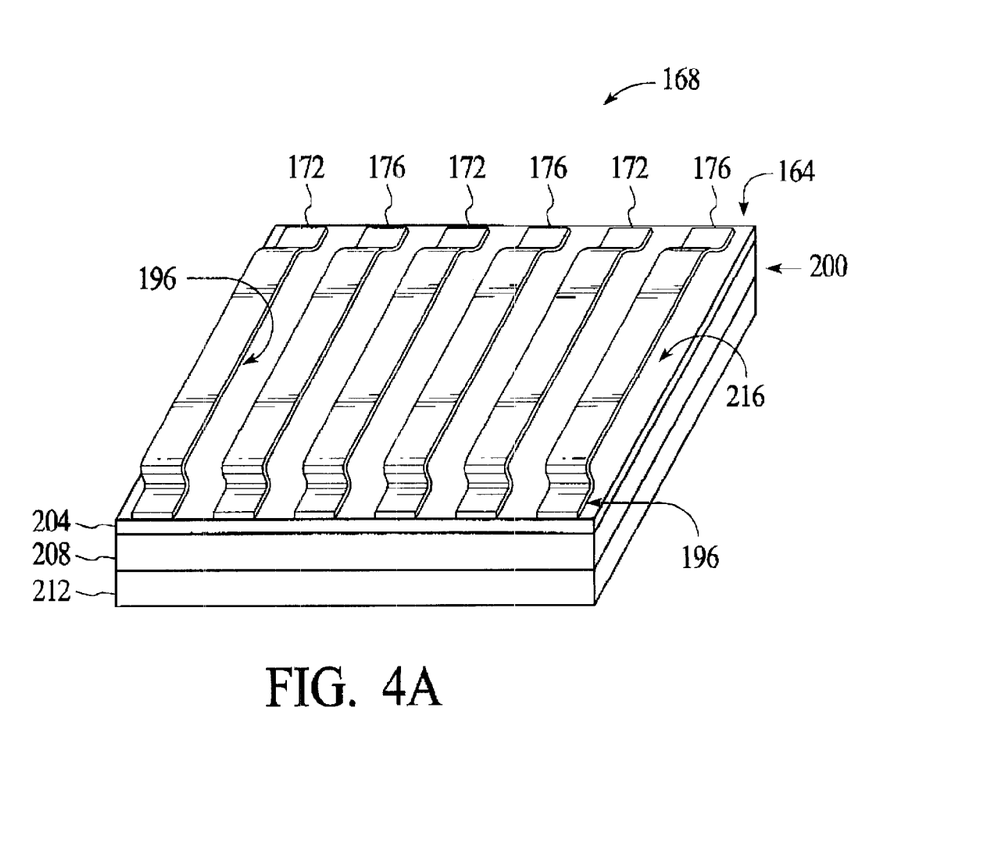

In one version, the fixed and adjustable reflectors 172, 176 are interleaved with one another to define a substantially continuous reflecting surface, as shown in FIG. 4a. In this version, the fixed and adjustable reflectors 172, 176 are both shaped as elongated strands, for example, having a ratio of length to width of at least about 10:1; however, other shapes may also be used. Each fixed reflector 172 is supported continuously along its length by a supporting material 186 underneath the fixed reflector 172, while each adjustable reflector 176 is displaceable at its middle portion. The reflectors 164 are interleaved with one another and spaced apart at about the same distances. The reflectors 164 comprise a material that is capable of reflectively diffracting the radiation beamlets 152. In one version, the reflectors 164 comprise a core material 188 and a coating material 192. A suitable core material 188 is one that may be displaced or deformed, such as for example, silicon nitride. The coating material 192 reflects the radiation beamlets 152, and may be, for example, aluminum. The reflectors 164 have downwardly bent tabs 196 which are anchored to a wafer 200. The wafer 200 may comprise multiple layers including a top layer 204, a middle layer 208, and a bottom layer 212, which are suitable to support the reflectors 164. In one example, the top layer 204 comprises tungsten, the middle layer 208 comprises oxide, and the bottom layer 212 comprises silicon. A plate 216 capable of being maintained at a voltage in relation to the adjustable reflectors 176 is embedded inside the wafer 200. The plate 216 comprises a material suitable to be set at a voltage in relation to the reflectors 164, such as a conductor material, for example aluminum or silver, or a material capable of being electrostatically charged, for example aluminum or silver. An exemplary adjustable reflective diffraction grating 160 is manufactured by Silicon Light Machines, Inc., Sunnyvale, Calif.

Figure 4B:
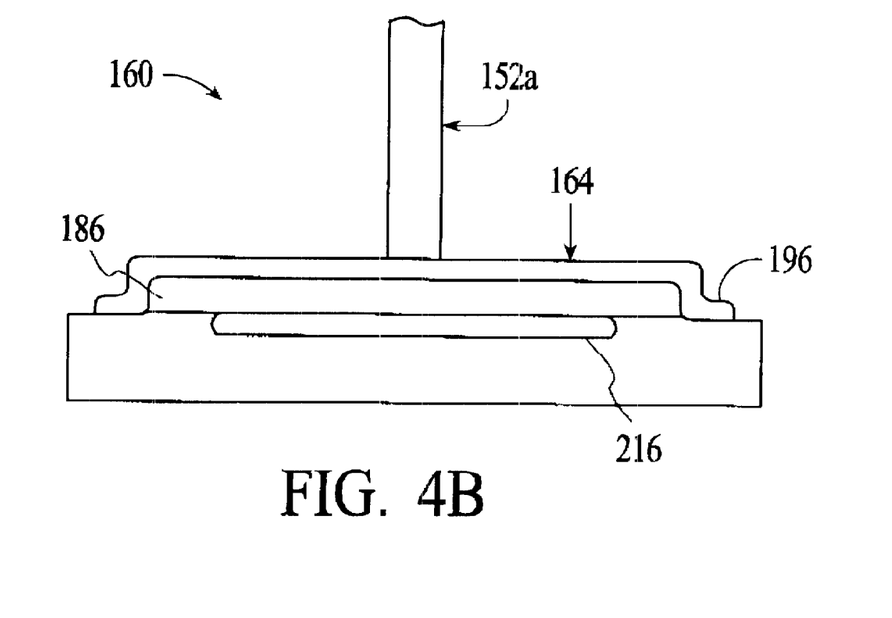
FIG. 4b is a schematic side view of a reflector cluster having fixed and adjustable reflectors, showing the adjustable reflectors in their first position.
Figure 4C:
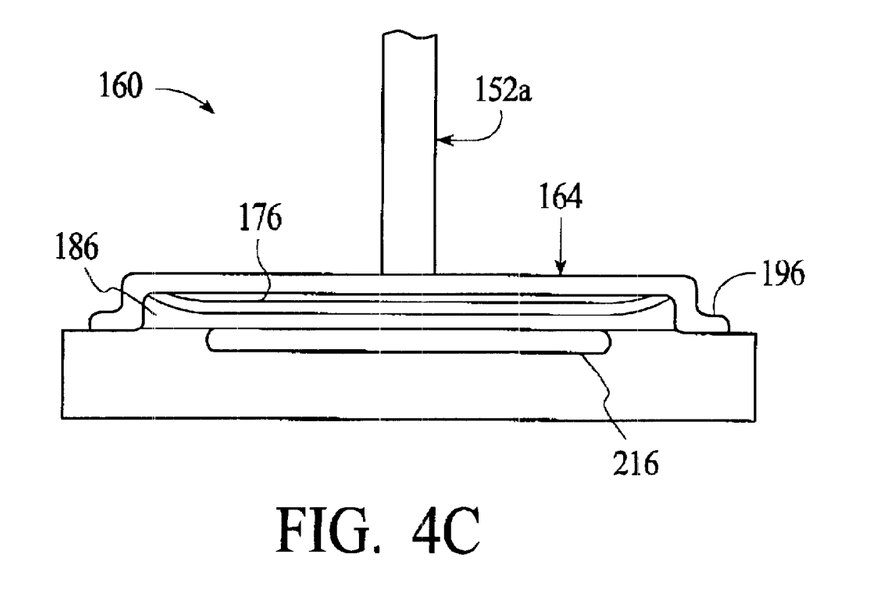
FIG. 4c shows the reflector cluster of FIG. 4b with the adjustable reflectors in their second positions to reflectively diffract an incident radiation beam.

Referring to FIGS. 4b and 4c, the adjustable reflective diffraction grating 160 of FIG. 4a is operated by providing a voltage to the plate 216 underlying the reflectors 164. When no voltage is applied to the plate 216 in relation to the adjustable reflectors 176, the adjustable reflectors 176 are in their first positions and flat and coplanar to the fixed reflectors 172, as shown in FIGS. 3b and 4b. A radiation beamlet 152a of the radiation beam that is incident on the reflectors 164 is specularly reflected at an angle of reflection substantially equal to the angle of incidence, as a zero-order radiation beamlet 220 which is blocked by a beam stop 228. However, when a voltage is applied to the plate 216 in relation to the adjustable reflectors 176, the adjustable reflectors 176 are displaced from their first unbiased positions 175a to their second biased positions 175b because they are attracted toward the voltage biased plate 216, as shown in FIGS. 3c and 4c. When a radiation beamlet 152a is incident on the reflectors 164, the radiation beamlet 152a is diffracted, creating beamlets 152 other than the zero-order beamlet 220, such as a first-order beamlet 224, which is diffracted back into the beam path 132. Thus, the radiation beamlet 152a does not pass through the beam intensity modulator 156 when no voltage is applied to the plate 216, and the radiation beamlet 152a does pass through the beam intensity modulator 156 when a voltage is applied to the plate 216. In this way, the reflectors 164 serve as an on/off switch. Also, the reflectors 164 may be used to fractionally tune the intensity of the reflectively diffracted first-order beamlet 224 by varying the voltage applied to the plate 216 because the intensity of the first-order beamlet 224 corresponds to the applied voltage. For example, the intensity of the first-order beamlet 224 may correspond linearly to the applied voltage. While this example is illustrated for first-order diffracted beamlets 224, higher-order beamlets, such as a second-order beamlet or third-order beamlet, may also be passed in the "on" state; or alternatively, a zero-order beamlet 220 may be passed in the "on" state, and a higher-order beamlet blocked in the "off" state.

The adjustable reflectors 176 may be displaced by a distance that is selected in relation to the wavelength of the radation beamlet 152. This version may be used to set a predetermined diffraction order of the diffracted radiation beamlet 152. For example, the displacement distance may be about one quarter of the wavelength of the radiation beamlet 152a. In one version, the adjustable reflective diffraction grating 160 may be used to modulate the intensities of the radiation beamlets 152 to reliably provide fractional beam intensities which are useful in the registration of grayscale images. The amount of displacement of the adjustable reflectors 176 may be tailored by controlling the applied voltage to generate diffracted radiation beamlets 152 having continuously variable intensities, for example, to replicate a grayscale image. The amount of displacement of the displaceable reflectors 176 affects the intensity of each reflectively diffracted beamlet 152, thereby allowing fractional beam intensity modulation. Also, the correspondence between the applied voltage and the intensity of a diffracted beamlet 152, may be non-linear, which may make a lookup table or functional approximation desirable to determine their relationship.

The voltage required to downwardly displace an adjustable reflector 176 from the first position is greater than the voltage required to upwardly displace an adjustable reflector 176 from the second position. In this case, a voltage of magnitude in between the two may be used to maintain the reflectors 164 in an "on" state with almost no power consumption. This hysteresis effect may also be advantageously used with the run length encoded (RLE) compression scheme used by a controller 228 of the apparatus 100. For example, a data string compressed in RLE might comprise a beam intensity command and a command to copy 20 times. The beam intensity command can be delivered to the reflectors 164 as a displacement voltage, whereas the copy command can be delivered to the reflectors 164 as a "maintain" voltage.

Figure 5:
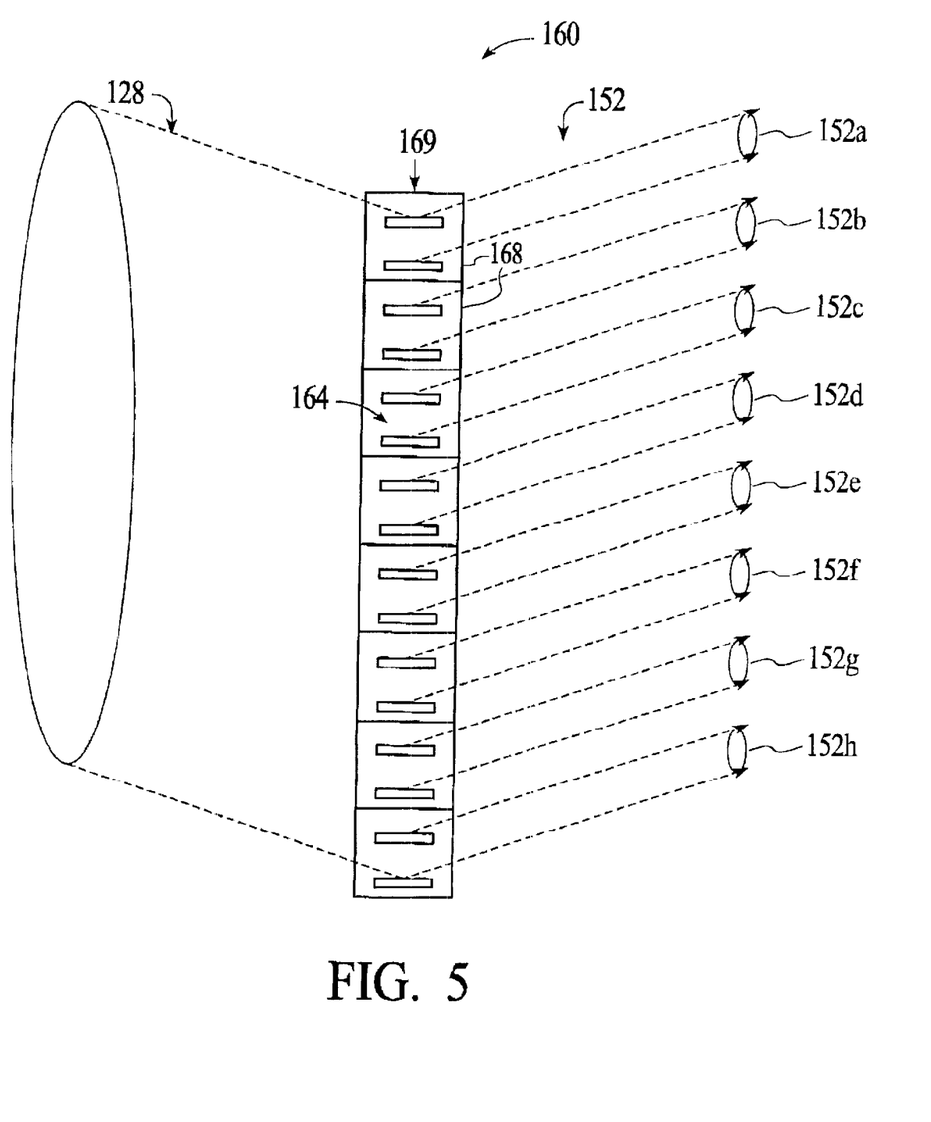
FIG. 5 is a schematic top view of an adjustable reflective diffraction grating that receives a single radiation beam and diffracts the beam into a number of radiation beamlets.

The radiation beam 128 may be also projected onto the adjustable reflective diffraction grating 160 to illuminate the entire grating 160, as shown in FIG. 5. This version may use the adjustable reflective diffraction grating 160 to split the radiation beam 128 into the radiation beamlets 152, so that a dedicated beam splitter 148 is not needed. In one version, the radiation beam 128 is cylindrically focused to be of substantially uniform illumination intensity across the surface of the adjustable reflective diffraction grating 160. The signals applied to the individual reflector clusters 168 may also be individually tuned or calibrated to compensate for significantly non-uniform illumination intensity, so that the diffracted beamlet intensity level remains substantially constant. For example, the voltages applied to the plates 216 of the individual reflector clusters 168 may be adjustable.

The data throughput of the adjustable reflective diffraction grating 160 is about proportional to the number of reflector clusters 168 multiplied by the modulation rate of an individual reflector cluster 168. An adjustable reflective diffraction grating 160 according to the present invention provides good image data processing rates while maintaining image resolution quality. For example, a typical adjustable reflective diffraction grating 160 is capable of modulating about 1,088 beamlets within about 16 gray levels at a rate of about 50 MHz, which corresponds to about 54.4 GHz of data throughput. This is about 34 times faster than the exemplary data throughput rate achieved by a conventional imaging apparatus of about 1.6 GHz. In another embodiment, an adjustable reflective diffraction grating 160 having about 1088 reflector clusters 168 that are modulated at about 1.6 MHz has about the same data throughput as an adjustable reflective diffraction grating 160 having about 32 reflector clusters 168 that are modulated at about 50 MHz, or an acousto-optic modulator (not shown) having about 32 channels that are modulated at about 50 MHz.

In one version, only some of the reflectors 164 of the adjustable reflective diffraction grating 160 are used to modulate the radiation beamlets 152, so that the image processing data throughput rate of the diffraction grating 160 matches the data throughput rate of the other components. This version is useful when other components or parameters of the apparatus 100 provide lower data throughput capability than the adjustable reflective diffraction grating 160. In one example, since the speed of the substrate support 108 that may be used is approximately proportional to the number of individual radiation beamlets 152, if the speed of the substrate support 108 using all the reflectors 164 is too fast, the number of addressed reflectors 164 can be reduced until a desirable set speed of the substrate support 108 is achieved.

Returning to FIG. 1, after the radiation beamlets 152 are modulated by the adjustable reflective diffraction grating 160, the modulated beamlets 152 are scanned across the substrate 108 to register the image on the substrate 104. The scanning may be performed by a beam scanner 236, such as for example, a rotating polygon mirror, that raster scans the modulated radiation beamlets 152 along a scan direction across the substrate 104, while the support motor 112 moves the substrate support 108 in a direction substantially perpendicular to the scan direction. The polygon mirror rotates to change the angles of incidence and reflection of the radiation beamlets 152 to scan the beamlets 152 along a scanning stripe. A scan lens 240 translates the changing angles of the beamlets 152 to a change in position of the beamlets 152. A reduction lens 244 reduces the size of the beam spot by a predefined demagnification factor. The "scan rate" is the distance per unit time that the beamlets 152 travel across the substrate 104 due to the motion of the support 108 as well as the motion of the beam scanner 236. The scan rate is approximately equal to the product of the scan rate due to the beam scanner 236 scanning the beamlets 152 across the substrate 104 by displacing the beamlets 152 and the scan rate due to the support motor 112 scanning the beamlets 152 across the substrate 104 by moving the substrate support 108 relative to the beamlets 152. The scan rate desirable for an apparatus 100 is about equal to the pixel size of the image multiplied by the modulation rate of the beam intensity modulator 156. For example, for an image having a pixel size of about 100 nanometers, beamlets 152 that are modulated by a beam intensity modulator 156 having a modulation rate of about 50 MHz are scanned across the substrate 104 at a total scan rate of about 5 m/s. For the same pixel size, beamlets 152 being modulated by a beam intensity modulator 156 having a modulation rate of about 1.6 MHz are scanned across the substrate 104 at a total scan rate of about 160 mm/s.

The number of reflector clusters 168 and the modulation rate of a modulation signal applied to the beam intensity modulator 156 are selected to scan the radiation beam 128 across the substrate 104. In another version, the number of reflector clusters 168 and the modulation rate of the signal applied to the individual reflector clusters 168, are selected to allow the motion of the substrate support 108 to scan the radiation beamlets 152 across the substrate 104 without the use of a separate beam scanner 236. This version of the apparatus 100 does not need a separate beam scanner 236 because the scan rate is maintained at less than about 1 m/s at which speed the support motor 112 is capable of moving the substrate support 108. For example, the number of reflector clusters 168 may be sufficiently increased, and the modulation rate of the signal applied to the individual reflector clusters 168 may be sufficiently reduced, so that the motion of the substrate support 108 generated by the support motors 112 is sufficiently fast to scan the modulated radiation beamlets 152 across the substrate 104. The reflector clusters 168 are substantially aligned along a line to modulate a linearly spaced-apart array of beamlets 152 that forms a "brush" across the substrate 104. The support motor 112 moves the substrate support 108 to scan the beamlets 152 substantially across a first horizontal axis of the substrate 104. The support motor 112 then moves the substrate support 108 (and substrate 104) upward along a vertical axis substantially orthogonal to the first horizontal axis, and then moves the substrate support 108 to scan the beamlets 152 substantially across a second horizontal axis of the substrate 104, which is below the first axis. This action is repeated to scan the beamlets 152 across the entire surface of the substrate 104. In one version, a suitable number of reflector clusters 168 is at least about 160 and maybe even at least about 300 clusters. Each cluster 168 modulates a single beamlet 152, thus, the number of the beamlets 152 needed is the same as the number of clusters 168. In addition, the modulation rate of the signal applied to the clusters 168 may also be reduced to less than about 10 Mhz or even less than about 8 Mhz. An apparatus having 160 clusters 158 whose signals are modulated at a rate of about 10 MHz, provide a scan rate of less than about 1 m/s for a pixel size of about 100 nanometers while maintaining a typical data throughput for a conventional apparatus of about 1.6 GHz. In this version, the support motor 112 provides the entire scanning mechanism.

The number of clusters 158, and the number of radiation beamlets 152 that can be modulated, may be limited by characteristics of the image registration apparatus 100 to less than about 2000. For example, the size of the scan lens 240 may limit the number of radiation beamlets 152 that can pass therethrough without substantial aberration. However, larger scan lenses 240 would allow the use of a larger number of radiation beamlets 152.

In operation, the substrate 104, on which an image is to be registered, is placed on, and held by, the substrate support 108. A fiducial mark locator 248 is provided to measure the actual locations of fiducial marks 252 of the substrate 104 to determine the position of the substrate 104, substrate distortions, or mis-registrations. The fiducial marks 252 may be holes, light reflective markings, diffraction gratings, or previously registered spots or images. The fiducial mark locator 248 generally comprises an optical detector capable of detecting the fiducial marks 252 of the substrate 104, such as a charge-coupled device (CCD) camera. The optical detector monitors a change in the light transmitted through, or reflected back from, the substrate 104 to determine the actual locations of the fiducial marks 252 of the substrate 104.

A controller 228 comprising a suitable configuration of hardware, software, or programmable logic devices, is adapted to control the substrate support 108, radiation beam source 124, and beam intensity modulator 156 to modulate and scan the radiation beam 128 across the substrate 104 to register the image on the substrate 104. The controller 228 is adapted to receive data, calculate the location of the substrate 104 and any substrate distortion levels, determine a correction operator for the stored image, and operate the beam source 124 and beam modulating components 136. In one exemplary embodiment, the controller 228 receives data of the measured locations of the fiducial marks 252 and compares them to their original or design locations to determine the deviation of each fiducial mark 252. The fiducial mark deviations are used to correct the encoded image to be registered on the substrate 104. The controller 228 then controls, for example, the adjustable reflective diffraction grating 160, beam scanner 236, and scan lens 240 to register the correctly encoded image on the substrate 104. For example, the controller 228 sends signals to the beam intensity modulator 156 to control pulsing of the radiation beamlets 152 to the desired intensity levels and in correspondence to the image. The beam intensity modulator 156 may also be controlled to scale the image in the scanning direction by timing the beamlet pulses. The support motor 112 also receives real time instructions from the controller 228 to control the motion of the substrate support 108, and consequently the substrate 104, to scale, rotate, or translate the image projected on the substrate 104. Typically, an array of radiation beamlets 152 is scanned across the substrate 104 in nearly horizontal passes which are repeated along a first vertical stripe, after which the beamlets 152 are scanned in second horizontal passes along a second vertical stripe, and so forth. Thus, the controller 228 operates the radiation beam source 124, modulating components 176, and the support motor 112 to raster scan the radiation beamlets 152 across the substrate 104 in multiple passes.

The controller 228 may be a computer that executes software of a computer-readable program residing in a computer system comprising a central processing unit (CPU) 256, such as for example, a Pentium Controller commercially available from Intel Corporation, Santa Clara, Calif., that is coupled to a memory and peripheral computer components. The memory may comprise a computer readable medium having the computer readable program therein. The memory may be hard disks 260, an optical compact disc (CD), floppy disk, random access memory (RAM) 264, or other types of volatile or non-volatile memory, suitable for storing fiducial mark locations, calculated fiducial mark deviations, correction operators, or corrected images.

The interface between a human operator and the controller 228 can be, for example, via a display 268 and data input device 272, such as a keyboard. Other computer-readable programs such as those stored in other memory including, for example, a floppy disk or other computer program product inserted in a drive of the memory may also be used to operate the controller 228. The computer system card rack contains a single board computer, analog and digital input/output boards, interface boards, and stepper motor controller boards. Various components of the apparatus conform to the Versa Modular European (VME) standard, which defines board, card cage, and connector dimensions and types. The VME standard also defines the bus structure having a 16-bit data bus and 24-bit address bus.

The computer-readable program generally comprises software comprising a set of instructions to operate the radiation beam image registration apparatus 100. The computer-readable program can be written in any conventional programming language, such as for example, assembly language, C, C++ or Pascal. Suitable program code is entered into a single file, or multiple files, using a conventional text editor and stored or embodied in the memory of the computer system. If the entered code text is in a high-level language, the code is compiled, and the resultant compiler code is then linked with an object code of pre-compiled library routines. To execute the linked, compiled object code, the user invokes the object code, causing the CPU 256 to read and execute the code to perform the tasks identified in the program.

Thus, the present apparatus 100 and method is advantageous because it allows for improved throughput in modulating the intensities of radiation beams. Although the present invention has been described in considerable detail with regard to certain preferred versions thereof, other versions are possible. For example, the present invention could be used with other image registration apparatuses, such as an apparatus that registers an image using substantially incoherent light. Thus, the appended claims should not be limited to the description of the preferred versions contained herein.

What is claimed is:

1. An image registration apparatus comprising:

a substrate support capable of supporting a substrate, the substrate support comprising a support motor;

a radiation beam source capable of providing a radiation beam;

a beam intensity modulator comprising an adjustable reflective diffraction grating capable of reflectively diffracting the radiation beam to modulate the intensity of the radiation beam; and a controller adapted to control the substrate support, radiation beam source, and beam intensity modulator to modulate and scan the radiation beam across the substrate to register an image on the substrate.

2. An apparatus according to claim 1 wherein the adjustable reflective diffraction grating comprises a plurality of adjustable reflectors that are adjustable between first and second positions.

3. An apparatus according to claim 2 wherein the first position comprises a non-diffracting position and the second position comprises a diffracting position.

4. An apparatus according to claim 2 comprising a plurality of fixed reflectors.

5. An apparatus according to claim 4 wherein the adjustable and fixed reflectors are arranged in one or more reflector clusters such that each cluster is adapted to reflectively diffract a radiation beamlet of the radiation beam.

6. An apparatus according to claim 5 wherein the reflector clusters are arranged substantially along a line.

7. An apparatus according to claim 5 comprising from about 100 to about 2000 reflector clusters.

8. An apparatus according to claim 5 wherein the number of reflector clusters and the modulation rate of a modulation signal applied to the beam intensity modulator are selected to allow scanning of the radiation beam across the substrate substantially absent a beam scanner.

9. An apparatus according to claim 8 comprising at least about 160 reflector clusters.

10. An apparatus according to claim 8 wherein the modulation rate of the modulation signal is less than about 10 MHz.

11. An apparatus according to claim 1 further comprising a beam scanner to scan the radiation beam across the substrate to register the image on the substrate, and wherein the controller controls the beam scanner.

12. An apparatus for registering an image on a mask blank, the apparatus comprising:

a substrate support capable of supporting a mask blank, the substrate support comprising a support motor;

a laser beam source capable of providing a laser beam that may be split into a plurality of laser beamlets;

a beam intensity modulator comprising an adjustable reflective diffraction grating capable of reflectively diffracting the laser beamlets to modulate the intensities of the laser beamlets, the adjustable reflective diffraction grating comprising a plurality of fixed reflectors and a plurality of adjustable reflectors that are adjustable between first and second positions; and a controller adapted to control the substrate support, laser beam source, and beam intensity modulator, to modulate and scan the laser beamlets across the mask blank to register an image on the mask blank.

13. An apparatus according to claim 12 wherein the adjustable and fixed reflectors are arranged in one or more reflector clusters such that each cluster is adapted to reflectively diffract a laser beamlet.

14. An apparatus according to claim 13 wherein the number of reflector clusters and the modulation rate of a modulation signal applied to the beam intensity modulator are selected to allow scanning of the laser beamlets across the mask blank substantially absent a beam scanner.

15. An apparatus according to claim 14 comprising at least about 160 reflector clusters.

16. An apparatus according to claim 14 wherein the modulation rate of the modulation signal is less than about 10 MHz.

17. An apparatus for registering an image on a mask blank, the apparatus comprising:

a substrate support capable of supporting a mask blank, the substrate support comprising a support motor;

a laser beam source capable of providing a laser beam that may be split into a plurality of laser beamlets;

a beam intensity modulator comprising an adjustable reflective diffraction grating capable of reflectively diffracting the laser beamlets to modulate the intensities of the laser beamlets, the adjustable reflective diffraction grating comprising at least about 160 reflector clusters, each reflector cluster comprising a plurality of fixed and adjustable reflectors that are adapted to reflectively diffract a laser beamlet, and wherein the adjustable reflectors are adjustable between first and second positions; and a controller adapted to control the substrate support, laser beam source, and beam intensity modulator, to modulate the laser beamlets at a modulation rate of less than about 10 MHz while scanning the laser beamlets across the mask blank to register an image on the mask blank.

18. An apparatus according to claim 17 wherein the reflector clusters are arranged substantially along a line.

19. An apparatus according to claim 17 comprising less than about 2000 reflector clusters.

* * * * *